(12) United States Patent
Inaba

(10) Patent No.: US 10,644,182 B2
(45) Date of Patent: May 5, 2020

(54) SOLAR CELL MODULE AND CONDUCTOR

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventor: Hirotaka Inaba, Kariya (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/837,022

(22) Filed: Dec. 11, 2017

(65) Prior Publication Data

US 2018/0166601 A1 Jun. 14, 2018

(30) Foreign Application Priority Data

Dec. 12, 2016 (JP) ................................. 2016-240273

(51) Int. Cl.
*H01L 31/05* (2014.01)
*H01L 31/0465* (2014.01)
(Continued)

(52) U.S. Cl.
CPC .......... *H01L 31/0508* (2013.01); *H02S 20/30* (2014.12); *H01L 21/485* (2013.01);
(Continued)

(58) Field of Classification Search
CPC ............. H01L 31/0508; H01L 31/0481; H01L 31/0504; H01L 31/0516; H01L 31/049;
(Continued)

(56) References Cited

U.S. PATENT DOCUMENTS 3,422,213 A * 1/1969 Boodley ................... H01B 5/02
174/126.1
6,313,395 B1 11/2001 Crane et al.
(Continued)

FOREIGN PATENT DOCUMENTS

JP H0639935 * 11/2004
JP 2010-267717 A 11/2010
(Continued)

*Primary Examiner* — Michael Y Sun
(74) *Attorney, Agent, or Firm* — Sughrue Mion, PLLC

(57) ABSTRACT

A solar cell module includes: an at least one solar cell disposed between a first cover and a second cover; a sealing material that fills a gap between the first cover and the second cover to join them together, and seals the solar cell; and a tab line as a conductor electrically connected to the solar cell and enclosed by the sealing material between the first cover and the second cover, the tab line having a plurality of bases, and an expansion and contraction portion that can expand and contract in a longitudinal direction and connects the plurality of bases, the plurality of bases each being provided with a through hole and a connection base electrically connected to the solar cell, at least one of the first cover and the second cover having a boss as a positioning unit that positions the tab line.

2 Claims, 8 Drawing Sheets

(51) Int. Cl.
*H01L 31/046* (2014.01)
*H02S 20/30* (2014.01)
*H01L 23/00* (2006.01)
*H01L 23/40* (2006.01)
*H01L 21/48* (2006.01)
*H01L 23/535* (2006.01)
*H01L 23/538* (2006.01)
*H01L 21/768* (2006.01)
*H01L 23/528* (2006.01)
*H01L 23/522* (2006.01)
*H01L 27/146* (2006.01)
*H02S 40/36* (2014.01)
*H01L 31/18* (2006.01)
*H01L 33/38* (2010.01)
*H01L 31/048* (2014.01)

(52) U.S. Cl.
CPC ...... *H01L 21/768* (2013.01); *H01L 21/76816* (2013.01); *H01L 23/4093* (2013.01); *H01L 23/528* (2013.01); *H01L 23/5226* (2013.01); *H01L 23/535* (2013.01); *H01L 23/5386* (2013.01); *H01L 24/73* (2013.01); *H01L 24/90* (2013.01); *H01L 27/14636* (2013.01); *H01L 31/046* (2014.12); *H01L 31/0465* (2014.12); *H01L 31/0481* (2013.01); *H01L 31/05* (2013.01); *H01L 31/0504* (2013.01); *H01L 31/0512* (2013.01); *H01L 31/0516* (2013.01); *H01L 31/188* (2013.01); *H01L 33/387* (2013.01); *H01L 2224/72* (2013.01); *H01L 2224/90* (2013.01); *H02S 40/36* (2014.12); *Y02E 10/50* (2013.01)

(58) Field of Classification Search
CPC ............ H01L 31/0512; H01L 31/0488; H01L 31/048; H01L 33/387; H01L 31/188; H01L 31/05; H01L 27/14636; H01L 31/046; H01L 31/0465; H01L 23/5226; H01L 21/76816; H01L 23/528; H01L 21/768; H01L 23/5386; H01L 23/535; H01L 21/485; H01L 24/90; H01L 23/4093; H01L 2224/72; H01L 24/73; H01L 2224/90; H01L 31/042; H02S 20/30; H02S 40/36; Y02E 10/50

See application file for complete search history.

(56) References Cited

U.S. PATENT DOCUMENTS

| | | | |
|---|---|---|---|
| 2003/0108401 A1* | 6/2003 | Agha | F16B 41/002 411/353 |
| 2004/0200522 A1* | 10/2004 | Fukawa | H01L 31/022425 136/259 |
| 2005/0257823 A1* | 11/2005 | Zwanenburg | B64G 1/443 136/244 |
| 2005/0268959 A1* | 12/2005 | Aschenbrenner | H01L 31/0508 136/244 |
| 2012/0118352 A1* | 5/2012 | Asami | H01L 31/048 136/246 |
| 2016/0276509 A1 | 9/2016 | Mitsuzawa et al. | |

FOREIGN PATENT DOCUMENTS

| | | | | |
|---|---|---|---|---|
| JP | 2015-223065 A | 12/2015 | | |
| JP | 2016-171274 A | 9/2016 | | |
| WO | 2013018533 A1 | 2/2013 | | |
| WO | WO-2013018533 A1 * | 2/2013 | | H01L 31/0508 |

* cited by examiner

SOLAR CELL MODULE AND CONDUCTOR

This nonprovisional application is based on Japanese Patent Application No. 2016-240273 filed on Dec. 12, 2016 with the Japan Patent Office, the entire contents of which are hereby incorporated by reference.

BACKGROUND OF THE INVENTION

Field of the Invention

The present invention relates to a solar cell module and a conductor, and more particularly to a solar cell module mounted on a vehicle and a conductor for use in the solar cell module.

Description of the Background Art

Japanese Patent Laying-Open No. 2015-223065 discloses a structure in which adjacent solar cell strings are electrically wired in series using busbar members.

SUMMARY OF THE INVENTION

A solar cell module according to the present disclosure includes: an at least partially transparent first cover in the form of a plate; a second cover disposed opposite the first cover; an at least one solar cell disposed between the first cover and the second cover; a sealing material that fills a gap between the first cover and the second cover to join them together, and seals the solar cell; and a conductor electrically connected to the solar cell and enclosed by the sealing material between the first cover and the second cover, the conductor having a plurality of bases, and a wire that can expand and contract in a longitudinal direction and connects the plurality of bases, the plurality of bases each being provided with a through hole and a connection base electrically connected to the solar cell, at least one of the first cover and the second cover having a positioning unit inserted into the through hole of each of the plurality of bases to position the conductor.

DESCRIPTION OF THE PREFERRED EMBODIMENTS

Figure 1:
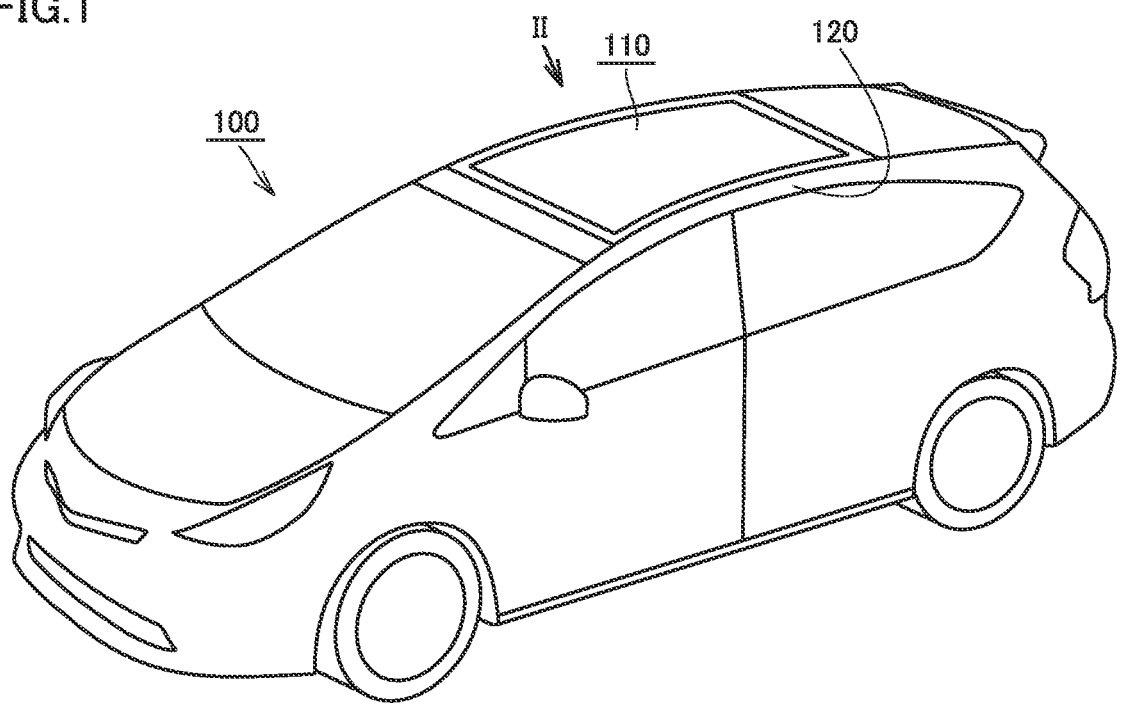
FIG. 1 is a perspective view showing an external appearance of a vehicle according to a first embodiment of the present invention.

In conventional techniques, when resin is used for a front face plate and a back face plate, solar cells are moved and displaced due to thermal expansion and contraction during lamination.

The use of resin for a front face plate and a back face plate is also problematic because a conductor is wrinkled due to thermal expansion and contraction during lamination and during use.

Thus, the present invention was made to solve the problems described above, and has an object to provide a solar cell module in which the movement of solar cells can be suppressed, and a conductor which is not wrinkled for use in the solar cell module.

A solar cell module according to the present invention includes: an at least partially transparent first cover in the form of a plate; a second cover disposed opposite the first cover; an at least one solar cell disposed between the first cover and the second cover; a sealing material that fills a gap between the first cover and the second cover to join them together, and seals the solar cell; and a conductor electrically connected to the solar cell and enclosed by the sealing material between the first cover and the second cover, the conductor having a plurality of bases, and a wire that can expand and contract in a longitudinal direction and connects the plurality of bases, the plurality of bases each being provided with a through hole and a connection base electrically connected to the solar cell, at least one of the first cover and the second cover having a positioning unit inserted into the through hole of each of the plurality of bases to position the conductor.

In the solar cell module thus configured, where at least one of the first cover and the second cover has the positioning unit for positioning the conductor, the conductor can be reliably positioned. In addition, as the conductor is electrically connected to the solar cell, the movement of the solar cell can be suppressed. As the wire that can expand and contract in the longitudinal direction is provided between the plurality of bases, the conductor is not bent even when the first and second covers expand and contract in a process of manufacturing the solar cell module. As a result, the occurrence of wrinkles in the conductor can be suppressed. Moreover, as the base is provided with the connection base, the conductor such as an interconnector to be connected to the solar cell can be connected at the connection base.

Preferably, a plurality of the solar cells are connected in a row by the conductor to form a solar cell string, and the positioning unit positions the conductor connected to both ends of the solar cell string. In this case, an outer end of the solar cell string is positioned, thereby reliably preventing displacement of the solar cell caused by the contraction and expansion of the first and second covers.

Preferably, the first cover includes a colored portion that shields inside of the first cover from outside, and the positioning unit is disposed between the colored portion and the second cover. In this case, the positioning unit is not externally visible, so that an aesthetically pleasing external appearance of the solar cell module can be maintained.

Preferably, the positioning unit is provided integrally with the colored portion. In this case, the positioning unit can be readily manufactured.

A conductor according to the present invention includes: a plurality of bases; and a wire that can expand and contract in a longitudinal direction and connects the plurality of bases, the plurality of bases each being provided with a through hole and a connection base connected to another conductor.

In the conductor thus configured, where the wire that can expand and contract in the longitudinal direction is provided between the plurality of bases, the conductor is not bent even during expansion and contraction in a process of manufacturing the solar cell module. As a result, the occurrence of wrinkles can be suppressed. Moreover, as the base is provided with the connection base, the conductor such as an interconnector to be connected to the solar cell can be connected at the connection base. The displacement of the solar cell can thereby be suppressed.

Preferably, the conductor includes one of a tab line and a between-strings connector.

According to the above configuration, the conductor can be reliably positioned using the positioning unit.

The foregoing and other objects, features, aspects and advantages of the present invention will become more apparent from the following detailed description of the present invention when taken in conjunction with the accompanying drawings.

A solar cell module, a mounted structure thereof and a vehicle including the solar cell module according to each embodiment of the present invention will be described below with reference to the drawings. In the following description, the same or corresponding parts in the drawings are designated by the same signs and description thereof will not be repeated.

First Embodiment

Figure 2:
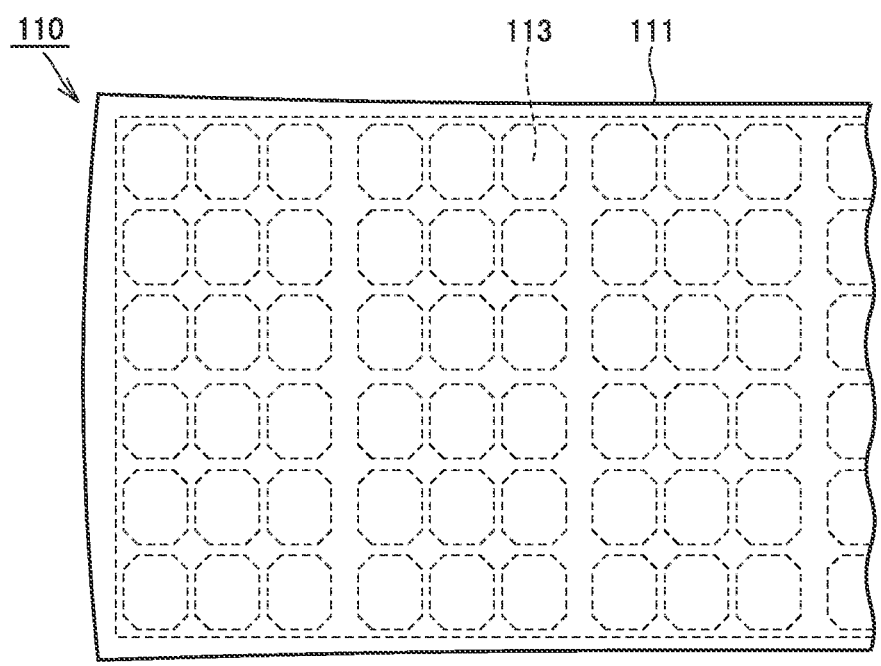
FIG. 2 is a plan view showing an external appearance of a solar cell module included in the vehicle according to the first embodiment of the present invention, as seen from a direction of an arrow II in FIG. 1.
Figure 3:
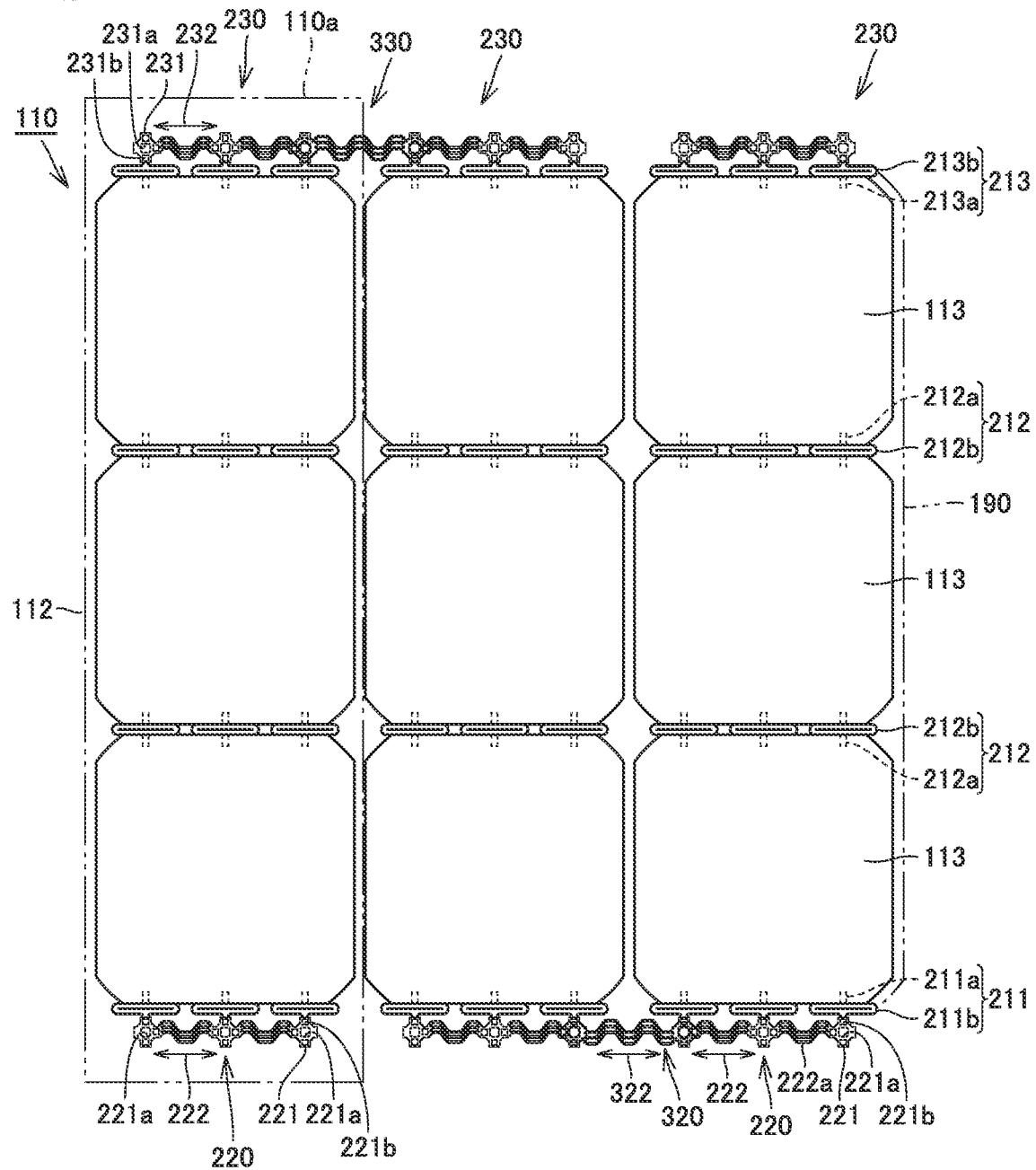
FIG. 3 is a plan view showing an enlarged internal structure of the solar cell module in FIG. 2, with a first cover removed.
Figure 4:
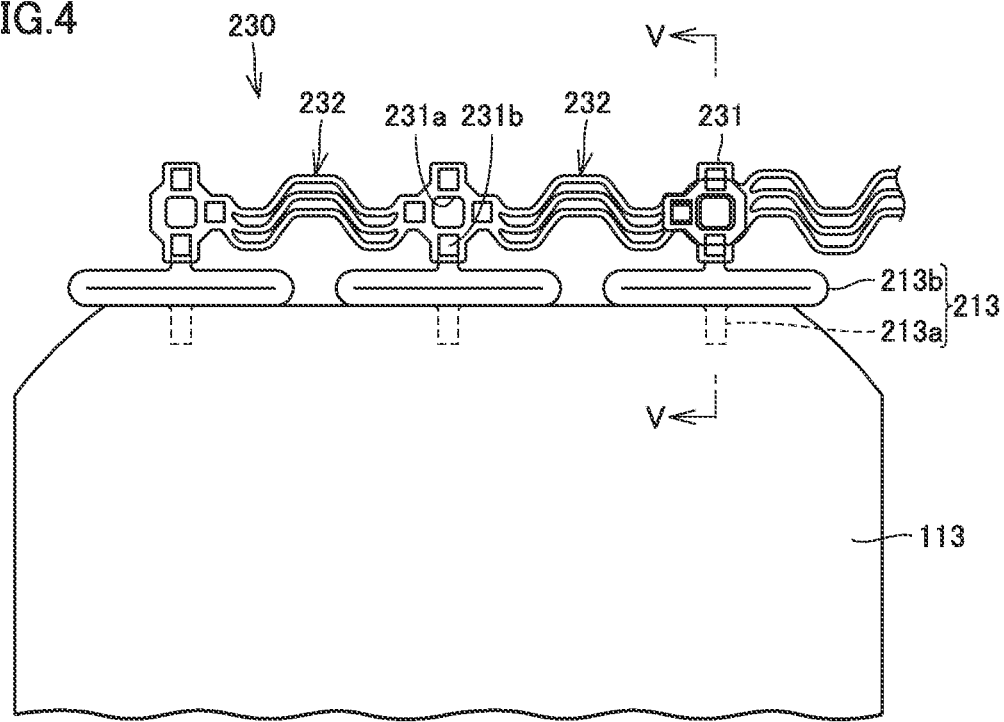
FIG. 4 is a plan view for illustrating a positioning structure.
Figure 5:
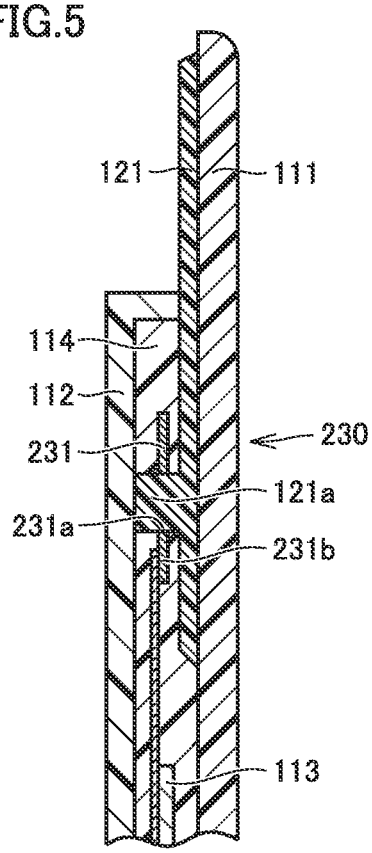
FIG. 5 is a sectional view taken along a line V-V in FIG. 4.

FIG. 1 is a perspective view showing an external appearance of a vehicle according to a first embodiment of the present invention. FIG. 2 is a plan view showing an external appearance of a solar cell module included in the vehicle according to the first embodiment of the present invention, as seen from a direction of an arrow II in FIG. 1. FIG. 3 is a plan view showing an enlarged internal structure of the solar cell module in FIG. 2, with a first cover removed. It is noted that only some of solar cells of the solar cell module are illustrated for the sake of simplicity. FIG. 4 is a plan view for illustrating a positioning structure. FIG. 5 is a sectional view taken along a line V-V in FIG. 4.

As shown in FIGS. 1 to 5, a vehicle 100 according to the first embodiment of the present invention is an automobile, and includes a solar cell module 110 forming the roof, and a roof side member 120 which is part of the vehicle body. The vehicle is not limited to an automobile, but may be a train, for example.

The solar cell module 110 includes a first cover 111 in the form of a plate serving as a front face plate, a second cover 112 disposed opposite the first cover 111 and serving as a back face plate, solar cells 113 disposed between the first cover 111 and the second cover 112, and a sealing material 114 that fills a gap between the first cover 111 and the second cover 112 to join them together, and seals the solar cells 113.

The first cover 111 has a substantially rectangular outer shape in plan view. The first cover 111 is a flat plate in the present embodiment, but may be curved. In the present embodiment, the first cover 111 is a plate made of polycarbonate. However, the first cover 111 is not limited thereto, but may be a plate made of another resin such as acrylic. The first cover 111 is formed by injection molding or extrusion molding of polycarbonate.

A portion of the first cover 111 that faces the solar cells 113 is transparent. Sunlight passes through the transparent portion and is applied to the solar cells 113. A portion of the first cover 111 that does not face the solar cells 113 may be rendered opaque by providing a colored portion 121. The inside of the first cover 111 can be shielded, and wires and adhesives around the solar cells 113 can be covered by the opaqueness. The colored portion 121 blocks visible light. A color of the colored portion 121 is not limited to a chromatic color such as red, yellow, green, blue or purple, but may be an achromatic color such as white, gray or black, as long as it is not transparent.

The second cover 112 has a substantially rectangular outer shape in plan view. The second cover 112 is in the form of a flat plate in the present embodiment, but is curved with substantially the same radius of curvature as the first cover 111 when the first cover 111 is curved.

In the present embodiment, the second cover 112 is a plate made of polycarbonate. However, the second cover 112 is not limited thereto, but may be a plate made of another resin such as acrylic, a plate made of CFRP (carbon-fiber-reinforced plastic) or a plate made of metal such as aluminum, or may be a sheet made of resin such as polyethylene terephthalate.

The second cover 112 is formed by injection molding of polycarbonate. The second cover 112 may be transparent or opaque.

The plurality of solar cells 113 are arranged in a matrix at a distance from one another. The plurality of solar cells 113 are electrically connected to one another. Specifically, the plurality of solar cells 113 arranged in a row are connected in series, to form a solar cell string 110a. A plurality of the solar cell strings 110a are connected in series.

The sealing material 114 is located in a region interposed between the first cover 111 and the second cover 112. The sealing material 114 is in contact with the first cover 111, the second cover 112 and the solar cells 113.

In the present embodiment, the sealing material 114 is made of EVA (Ethylene-Vinyl Acetate). However, a material forming the sealing material 114 is not limited to the EVA, but may be PVB (Poly Vinyl Butyral), silicone resin, ionomer resin or the like.

Interconnectors 211, 212 and 213 are provided among the plurality of solar cells 113. The interconnector 211 has a pair of legs 211a and a flexible portion 211b provided between the pair of legs 211a. The interconnector 212 has a pair of legs 212a and a flexible portion 212b provided between the pair of legs 212a. The interconnector 213 has a pair of legs 213a and a flexible portion 213b provided between the pair of legs 213a.

The pairs of legs 211a, 212a and 213a are connected to the flexible portions 211b, 212b and 213b, respectively.

A tab line 220 has a plurality of bases 221, and an expansion and contraction portion 222 connecting the plurality of bases. A tab line 230 has a plurality of bases 231, and an expansion and contraction portion 232 connecting the plurality of bases.

One of the legs 211a is connected to the base 221. The other of the legs 211a is connected to the solar cell 113. One of the legs 212a and the other of the legs 212a are connected to the solar cells 113. One of the legs 213a is connected to the solar cell 113. The other of the legs 213a is connected to the base 231.

The bases 221 are each provided with a through hole 221a and a connection base 221b adjacent to the through hole. The bases 231 are each provided with a through hole 231a and a connection base 231b adjacent to the through hole.

A plurality of the tab lines 220 and a between-strings connector 320 connecting the plurality of tab lines 220 are disposed on the second cover 112. The tab lines 220 are connected to the legs 211*a* by solder or welding.

A plurality of the tab lines 230 and a between-strings connector 330 connecting the plurality of tab lines 230 are disposed on the second cover 112. The tab lines 230 are connected to the legs 213*a* by solder or welding.

The flexible portions 211*b*, 212*b* and 213*b* each have a readily deformable shape. The flexible portion 211*b* deforms as a distance between the pair of legs 211*a* varies. The flexible portion 212*b* deforms as a distance between the pair of legs 212*a* varies. The flexible portion 213*b* deforms as a distance between the pair of legs 213*a* varies.

A chain-double-dotted line 190 in FIG. 3 indicates the boundary between the colored portion and the transparent portion. The solar cells 113 are located on the inner side of the chain-double-dotted line 190. The solar cells 113 are located under the transparent portion of the first cover 111. The tab lines 220 and 230 are located under the colored portion of the first cover 111.

As shown in FIG. 5, the sealing material 114, the solar cell 113, and the colored portion 121 forming part of the first cover 111 are provided between the first cover 111 and the second cover 112.

The colored portion 121 is formed, on the surface of the first cover 111 facing the second cover, as one piece by two-color molding in the form of a frame around the periphery. The colored portion 121 is provided with a boss 121*a*. The boss 121*a* is inserted into the through holes 221*a* and 231*a*. The boss 121*a* is in contact with the second cover 112. The colored portion 121 is not limited to be provided around the periphery of the first cover 111, but may be provided elsewhere as long as that portion does not face the solar cells 113.

Although the boss 121*a* is provided on the colored portion 121 forming part of the first cover 111 in this embodiment, the boss 121*a* may be provided on the second cover 112. Alternatively, the boss 121*a* may be provided separately from the first cover 111 and the second cover 112.

The solar cell module 110 according to the first embodiment includes: the at least partially transparent first cover 111 in the form of a plate; the second cover 112 disposed opposite the first cover 111; the at least one solar cell 113 disposed between the first cover 111 and the second cover 112; the sealing material 114 that fills the gap between the first cover 111 and the second cover 112 to join them together, and seals the solar cell 113; and the bases 221 and 231 as conductors electrically connected to the solar cells 113 and enclosed by the sealing material 114 between the first cover 111 and the second cover 112, the first cover 111 having the boss 121*a* as a positioning unit for positioning the bases 221 and 231.

The plurality of solar cells 113 are connected in a row by the interconnectors 212 to form the solar cell string 110*a*, and the boss 121*a* positions the bases 221 and 231 connected via the interconnectors 211 and 213 to both ends of the solar cell string 110*a*, respectively. The boss 121*a* may position the tab lines 220 and 230 as conductors, or the interconnectors 211 and 213.

The first cover 111 includes the colored portion 121 that shields inside of the first cover from outside, and the boss 121*a* is disposed on the inner side of the colored portion 121. The boss 121*a* is provided integrally with the colored portion 121. The boss 121*a* is disposed between the colored portion 121 and the second cover 112.

Figure 6:
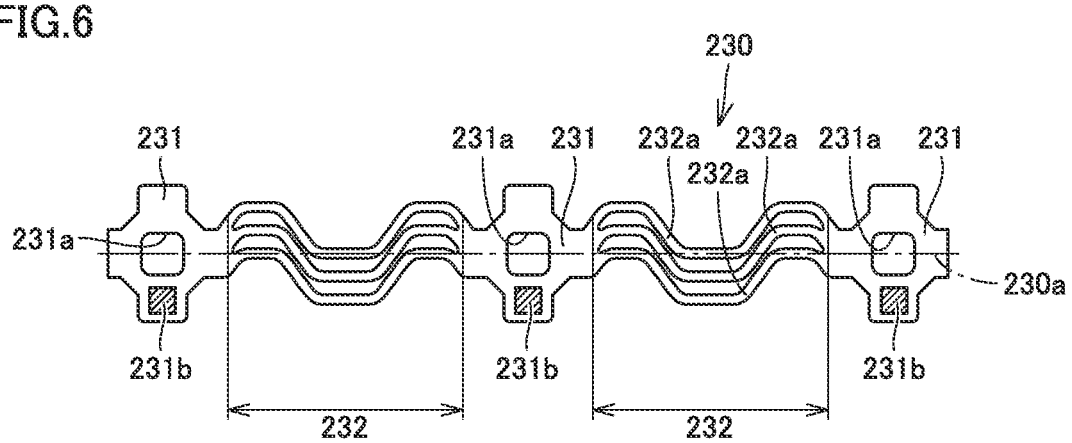
FIG. 6 is a plan view showing a tab line in detail.

FIG. 6 is a plan view showing the tab line in detail. As shown in FIG. 6, the tab line 230 includes three bases 231, and two expansion and contraction portions 232 connecting the three bases 231. The base 231 is formed of a metal plate. The base 231 is provided with the through hole 231*a* in its central portion. The base 231 is provided with the connection base 231*b* at its end portion to connect to the interconnector. The through hole 231*a* may be circular or square. The through hole 231*a* may also be an elongated hole.

The expansion and contraction portion 232 is formed of three corrugated wires 232*a*. The expansion and contraction portion is not limited to the corrugated wires 232*a*, but may be a wire in a mesh form, a three-dimensionally corrugated wire, a wire in a coil form or the like, as long as it has a shape that can expand and contract in the longitudinal direction.

The through hole 231*a* is provided on a center line 230*a* of the tab line 230. In addition, the center line 230*a* of the tab line 230 is the center of amplitude of the corrugated wires 232*a*. As the through hole 231*a* is provided on the center line 230*a*, the entire tab line 230 expands and contracts uniformly even when a force that causes expansion and contraction of the tab line 230 acts on the through hole 231*a*.

Figure 7:
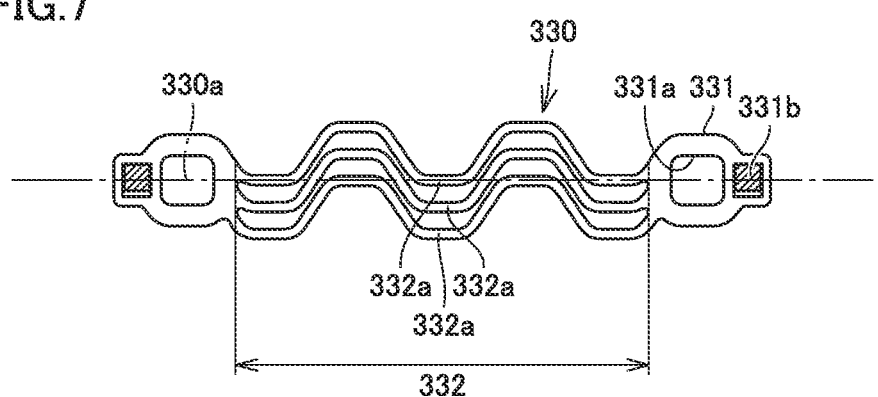
FIG. 7 is a plan view showing a between-strings connector in detail.

FIG. 7 is a plan view showing the between-strings connector in detail. As shown in FIG. 7, the between-strings connector 330 as a conductor has two bases 331, and one expansion and contraction portion 332 connecting the two bases 331. The base 331 is formed of a metal plate. The base 331 is provided with a through hole 331*a* in its central portion. The base 331 is provided with a connection base 331*b* at its end portion to connect to the tab line. The through hole 331*a* may be circular or square. The through hole 331*a* may also be an elongated hole.

The expansion and contraction portion 332 is formed of three corrugated wires 332*a*. The expansion and contraction portion is not limited to the corrugated wires 332*a*, but may be a wire in a mesh form, a three-dimensionally corrugated wire, a wire in a coil form or the like, as long as it has a shape that can expand and contract in the longitudinal direction.

The through hole 331*a* and the connection base 331*b* are provided on a center line 330*a* of the between-strings connector 330. In addition, the center line 330*a* of the between-strings connector 330 is the center of amplitude of the corrugated wires 332*a*. As the through hole 331*a* and the connection base 331*b* are provided on the center line 330*a*, the entire between-strings connector 330 expands and contracts uniformly even when a force that causes expansion and contraction of the between-strings connector 330 acts on the through hole 331*a* and the connection base 331*b*.

When the boss is inserted into the through hole 331*a*, the between-strings connector 330 is positioned by the through hole 331*a*.

The tab lines 220, 230 and the between-strings connectors 320, 330 as conductors are electrically connected to the solar cells 113 and enclosed by the sealing material 114 between the first cover 111 and the second cover 112. The tab lines 220, 230 and the between-strings connector 330 have the plurality of bases 221, 231, 331, and corrugated wires 222*a*, 232*a*, 332*a* that can expand and contract in the longitudinal direction and connect the plurality of bases 221, 231, 331, respectively. The plurality of bases 221, 231, 331 are provided with the through holes 221*a*, 231*a*, 331*a*, and the connection bases 221*b*, 231*b*, 331*b* electrically connected to the solar cells 113, respectively. At least one of the first cover 111 and the second cover 112 has the boss 121*a* that is inserted into the through holes 221*a*, 231*a*, 331*a* in the plurality of bases 221, 231, 331 and acts as a positioning unit for positioning the tab lines 220, 230 and the between-strings connector 330, respectively.

In the solar cell module, when resin is used for the first cover 111 and the second cover 112, displacement does not occur even when thermal expansion and contraction occurs during lamination, because the tab lines 220, 230 and the between-strings connectors 320, 330 are positioned mechanically by the boss 121a.

When resin is used for the first cover 111 and the second cover 112, the tab lines 220, 230 and the between-strings connectors 320, 330 expand and contract to follow the thermal expansion and contraction during lamination and during use. Thus, the tab lines 220, 230 and the between-strings connectors 320, 330 are not wrinkled or bent.

As the connection bases 221b and 231b are intended to be soldered, soldering to the interconnectors is facilitated. The connection at the connection bases 221b and 231b is not limited to be made by soldering or welding, but may be made using a conductive adhesive.

Second Embodiment

Figure 8:
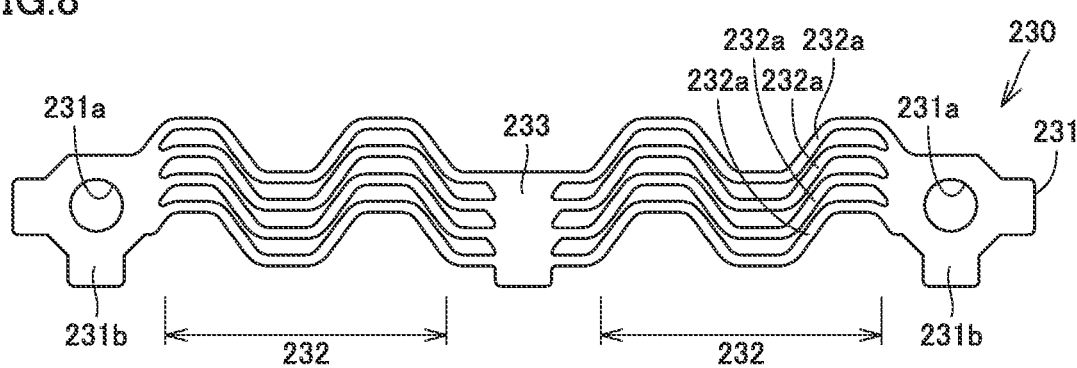
FIG. 8 is a plan view of the tab line according to a second embodiment of the present invention.

FIG. 8 is a plan view of the tab line according to a second embodiment of the present invention. In the tab line 230 according to the second embodiment, an additional base 233 is provided between the two bases 231, where the base 233 is not provided with a through hole but is only provided with a connection base. In addition, the expansion and contraction portion 232 connecting the bases 231 and 233 is formed of four corrugated wires 232a. The between-strings connectors 320 and 330 may be configured in a similar manner.

Many variations are possible, including employing a shape which attaches importance to expansion and contraction, or a shape which attaches importance to positioning, depending on the surrounding conditions. When a shape which attaches importance to expansion and contraction is employed, for example, the expansion and contraction of the corrugated wires 232a is facilitated by reducing the wave length or increasing the wave height (amplitude) of the corrugated wires 232a. When importance is attached to the positioning, the positioning is facilitated by providing a large number of through holes 231a for positioning and inserting the boss into each of the through holes 231a.

Although the embodiments of the present invention have been described, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A solar cell module comprising:
   an at least partially transparent first cover in the form of a plate;
   a second cover disposed opposite the first cover;
   a plurality of solar cells disposed between the first cover and the second cover;
   a sealing material that fills a gap between the first cover and the second cover to join them together, and seals the solar cells;
   a conductor electrically connected to the solar cells and enclosed by the sealing material between the first cover and the second cover; and
   a planar opaque portion that blocks visible light that is disposed between the conductor and the first cover on a rear side of the first cover,
   the conductor having a plurality of bases, and a wire that can expand and contract in a longitudinal direction and connects the plurality of bases, the plurality of bases each being provided with a through hole and a connection base electrically connected to the solar cells,
   at least one of the first cover and the second cover having a boss,
   wherein the boss is provided integrally with the planar opaque portion,
   wherein the plurality of the solar cells are connected in a row by the conductor to form a solar cell string,
   wherein the conductor and the plurality of the bases are connected to both ends of the solar cell string, and
   wherein the boss is inserted into the through hole of each of the plurality of bases to position the conductor.

2. The solar cell module according to claim 1, wherein the boss is disposed between the planar opaque portion and the second cover.

* * * * *